United States Patent
Chainer (10) Patent No.: US 8,344,516 B2
(45) Date of Patent: Jan. 1, 2013

(54) INTEGRATED CHIP CARRIER WITH COMPLIANT INTERCONNECTS

(75) Inventor: Timothy J. Chainer, Putnam Valley, NY (US)

(73) Assignee: International Business Machines Corporation, Armonk, NY (US)

( * ) Notice: Subject to any disclaimer, the term of this patent is extended or adjusted under 35 U.S.C. 154(b) by 59 days.

(21) Appl. No.: 12/986,460

(22) Filed: Jan. 7, 2011

(65) Prior Publication Data

US 2011/0101540 A1    May 5, 2011

Related U.S. Application Data

(62) Division of application No. 12/119,805, filed on May 13, 2008, now Pat. No. 7,898,087, which is a division of application No. 11/502,969, filed on Aug. 11, 2006, now Pat. No. 7,473,577.

(51) Int. Cl.
  *H01L 23/52* (2006.01)
  *H01L 23/48* (2006.01)
  *H01L 29/40* (2006.01)

(52) U.S. Cl. ............... 257/774; 257/E25.017; 257/686; 257/776; 438/672

(58) Field of Classification Search ........... 257/E23.079, 257/620, 621, 668, 686, 698, 730, 738, 774, 257/776–778; 438/459, 672
See application file for complete search history.

(56) References Cited

U.S. PATENT DOCUMENTS

| | | | | |
|---|---|---|---|---|
| 5,432,999 A * | 7/1995 | Capps et al. | ................. | 438/109 |
| 5,627,106 A * | 5/1997 | Hsu | ................................ | 438/459 |
| 5,777,383 A * | 7/1998 | Stager et al. | .................. | 257/700 |
| 5,973,396 A * | 10/1999 | Farnworth | ..................... | 257/698 |
| 6,020,217 A * | 2/2000 | Kuisl et al. | .................... | 438/106 |
| 6,028,364 A * | 2/2000 | Ogino et al. | ................... | 257/778 |
| 6,617,681 B1 * | 9/2003 | Bohr | ............................. | 257/700 |
| 6,809,421 B1 * | 10/2004 | Hayasaka et al. | ............. | 257/777 |
| 7,030,466 B1 * | 4/2006 | Hsuan | ............................ | 257/621 |
| 7,098,538 B1 * | 8/2006 | Tago et al. | ..................... | 257/758 |
| 7,344,959 B1 * | 3/2008 | Pogge et al. | ................... | 438/459 |
| 7,432,196 B2 * | 10/2008 | Tanida et al. | ................. | 438/667 |
| 7,504,722 B2 * | 3/2009 | Ochiai | ........................... | 257/730 |
| 7,605,019 B2 * | 10/2009 | Simon et al. | ................... | 438/109 |
| 2002/0027022 A1 * | 3/2002 | Moriizumi | ..................... | 174/267 |
| 2002/0055243 A1 * | 5/2002 | Lee | ................................ | 438/586 |
| 2007/0216041 A1 * | 9/2007 | Patti et al. | ...................... | 257/797 |

* cited by examiner

*Primary Examiner* — Chris Chu (74) *Attorney, Agent, or Firm* — Michael J. Buchenhorner; Vazken Alexanian (57) ABSTRACT

A silicon chip includes a silicon substrate, a plurality of pads, and a plurality of through vias to connect back-end-of-line wiring to the plurality of pads. The silicon substrate includes a layer of active devices and the back-end-of-line wiring connected to the active devices.

14 Claims, 13 Drawing Sheets

INTEGRATED CHIP CARRIER WITH COMPLIANT INTERCONNECTS

CROSS-REFERENCE TO RELATED APPLICATIONS

This application is a division of, and claims priority from, U.S. patent application Ser. No. 12/119,805, filed on May 13, 2008, which is incorporated by reference as if fully set forth herein.

STATEMENT REGARDING FEDERALLY SPONSORED-RESEARCH OR DEVELOPMENT

None.

INCORPORATION BY REFERENCE OF MATERIAL SUBMITTED ON A COMPACT DISC

None.

FIELD OF THE INVENTION

The invention disclosed broadly relates to the field of information handling systems, and more particularly relates to the field microelectronics packaging technology.

BACKGROUND OF THE INVENTION

Microelectronic chip packages use flip chip technology to mount chips onto a chip carrier substrate to provide high density interconnect of chips or space transformation to enable mounting of the ICs (integrated circuits) onto printed circuit boards. System performance and cost requirements for chip packaging are driving designers to use low cost organic chip carriers in place of more expensive ceramic or glass materials. However, a challenge is the mismatch between the coefficients of thermal expansion (CTEs) between organic chip carriers and silicon integrated circuit chips. This causes mechanical stress between the components during operation from environmental temperature excursion and also heat produced by the chips which results in temperature variations in the chip package structure.

Solutions to using organic chip carriers have included epoxy under fill between the chip and first level package to reduce the shear stain on the Controlled Collapse Chip Connection (C4) interconnects. In addition solutions have also been previously proposed to build compliant interconnects. Therefore a need exists to produce low cost compliant interconnects.

In addition, the development of very high density silicon chip carriers have been proposed as an intermediate interposer between IC's and the next level package to provide very high interconnect density and CTE match to the silicon chips. This will reduce the thermal induced stress on the C4 solder interconnects between the silicon chip and CTE matched silicon chip carrier and enable the reduction in C4 dimensions and increased I/O density. However, in the case where the next level package is an organic substrate the CTE of the silicon chip carrier will not be matched to the organic substrate which will result in stress on the C4 solder interconnects between carrier and next level package. Therefore, there exists a need to provide compliance between a silicon chip carrier and the next level package.

SUMMARY OF THE INVENTION

According to an embodiment of the present invention a device for incorporating compliance into a chip carrier made of silicon or another CTE matched material is achieved by a through via structure which provides compliance.

In another embodiment of the invention compliance between the chip and the next level package is achieved by incorporating a compliant structure into the chip substrate itself.

BRIEF DESCRIPTION OF THE DRAWINGS

FIG. 3A through FIG. 3L show a process of fabricating through vias with compliant material.

FIG. 5A through FIG. 5C show an integrated compliance fabricated into the silicon chip.

DESCRIPTION OF A PREFERRED EMBODIMENT

Figure 1:
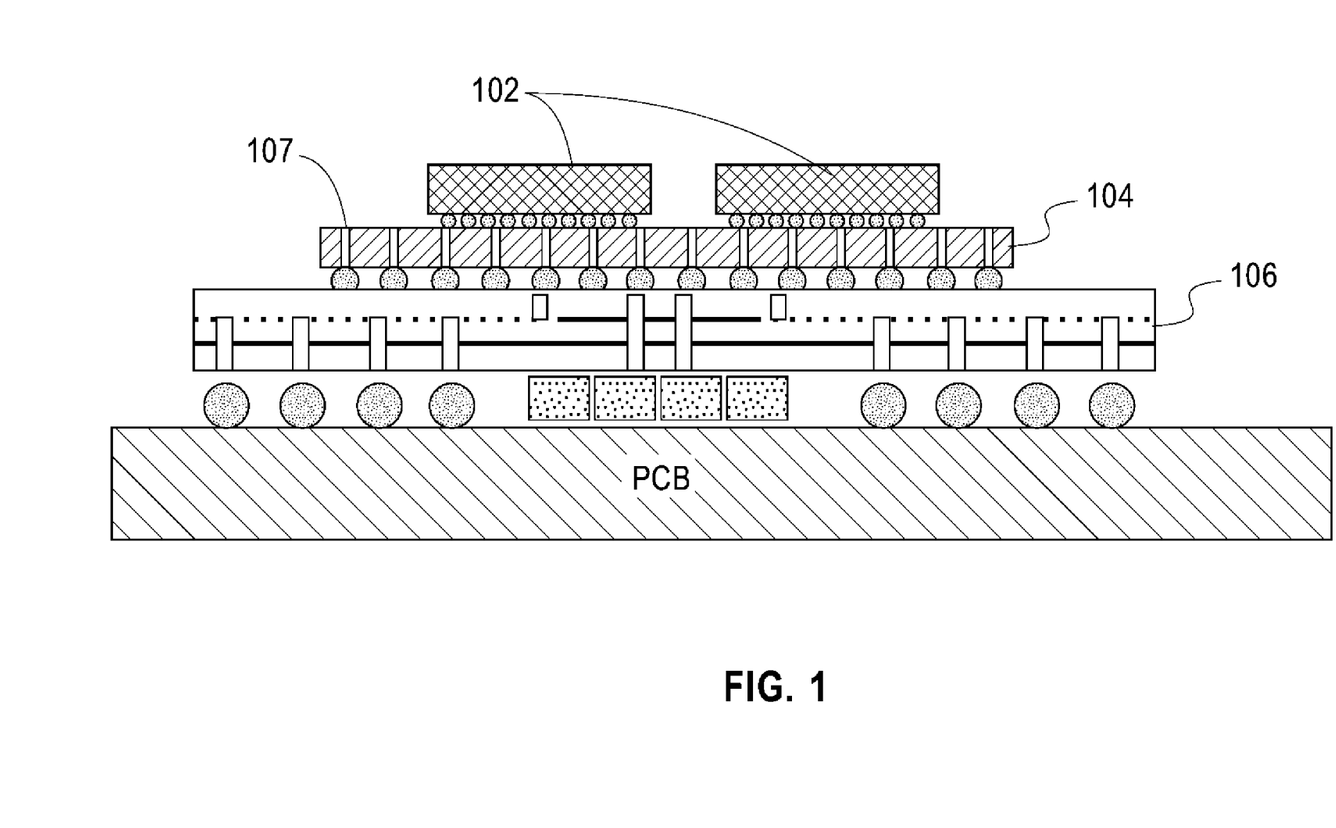
FIG. 1 is an illustration of a silicon interposer overview according to an embodiment of the present invention.

The development of high density chip carriers has included materials which are CTE matched to the chip, such as silicon or ceramic to provide higher interconnect density and bandwidth. As shown in FIG. 1, silicon chip carrier 104 provides a substrate which is CTE matched to the silicon chip 102. This will reduce the thermal induced stress on the C4 microjoin solder interconnects between the silicon chip and CTE matched silicon chip carrier and enable the reduction in C4 dimensions and increased I/O density. The silicon chip carrier routes power, ground and signals to the next level package using through vias and C4 solder interconnects. In the case where the next level package is an organic substrate the CTE of the silicon chip carrier will not be matched to the organic substrate which will result in stress on the C4 solder interconnects. Therefore, there exists a need to provide compliance between the silicon chip carrier and the next level package.

Referring again to FIG. 1, there is shown an illustration of a chip package 100 according to an embodiment of the present invention. The chip package comprises two electronic chips 102, a silicon carrier 104, whose top side is connected to the bottom side of the chip by solder bumps. The carrier 104 further comprises a CTE that approximately matches the CTE of the chips 102. According to this embodiment of the invention, the carrier 104 includes a plurality of compliant through vias 107 from the bottom side of the carrier to the top side of the carrier.

Figure 2:
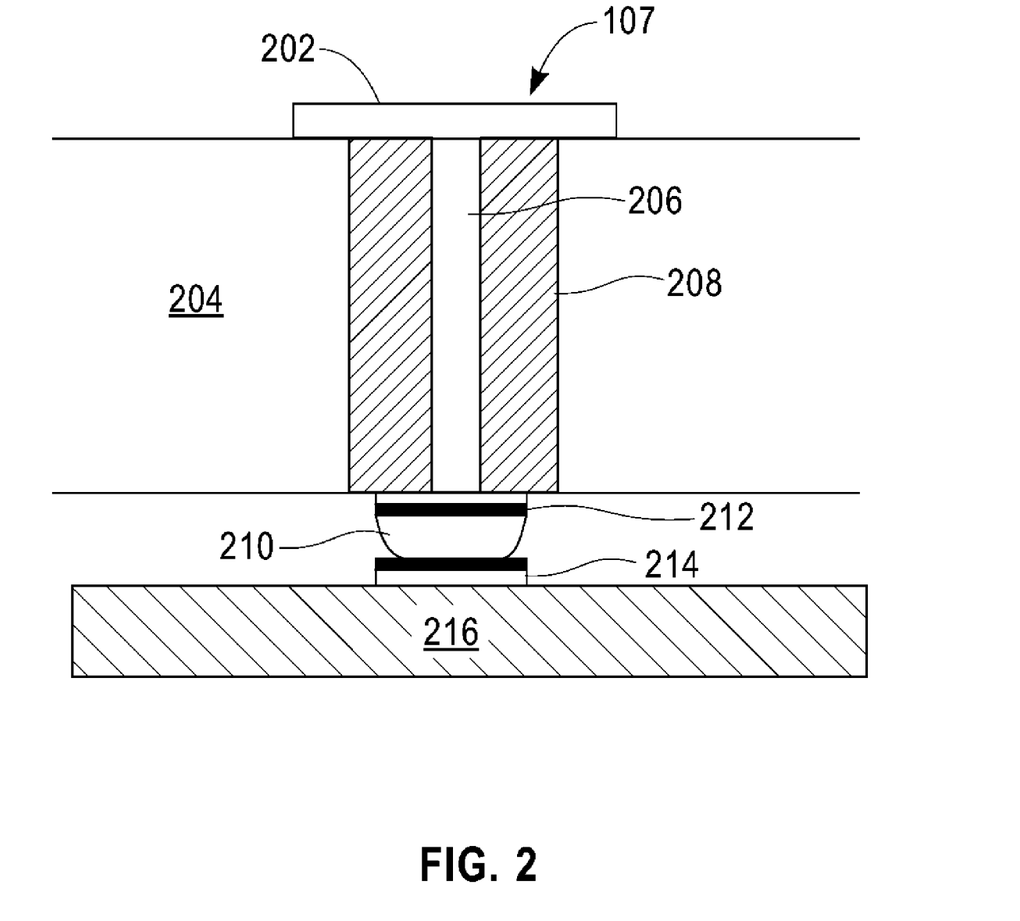
FIG. 2 shows a compliant interconnect according to an embodiment of the present invention.
Figure 3A:
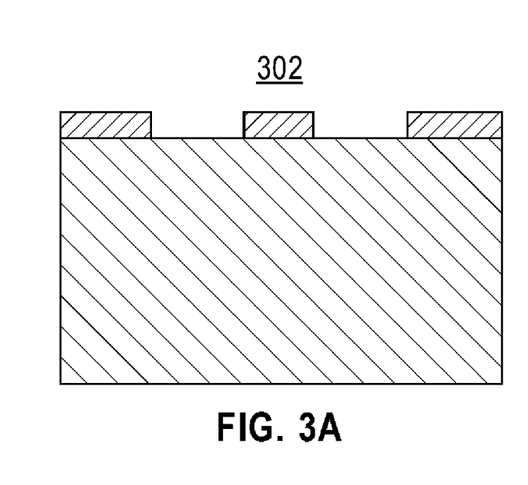
Figure 3B:
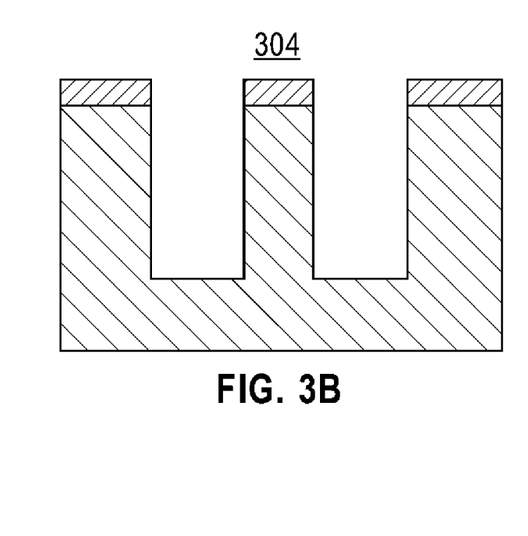
Figure 3C:
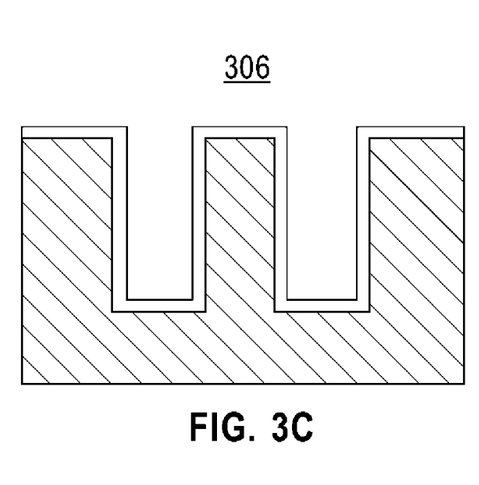
Figure 3D:
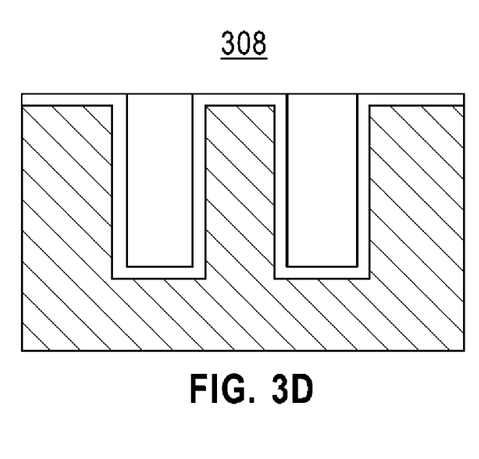
Figure 3E:
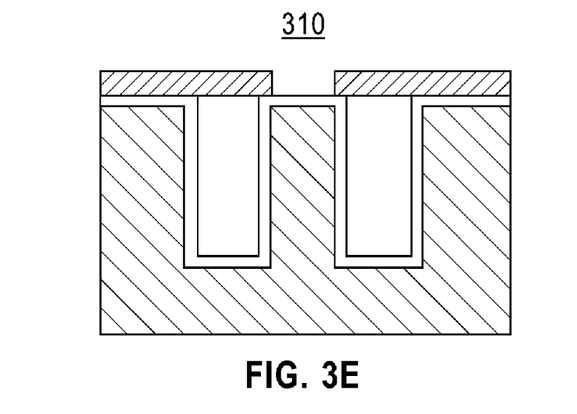
Figure 3F:
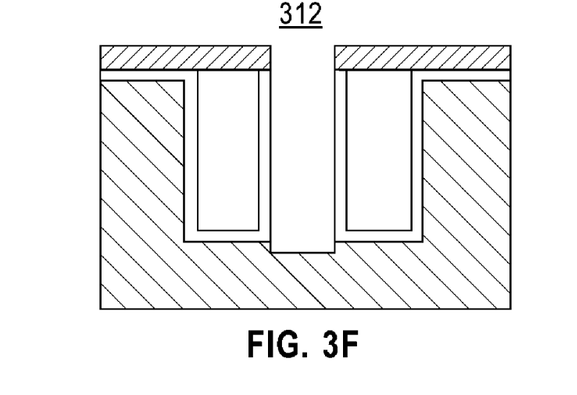
Figure 3G:
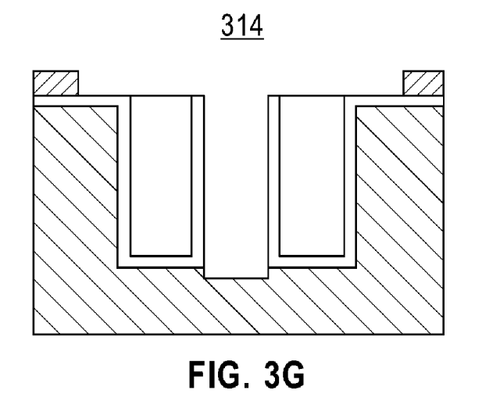
Figure 3H:
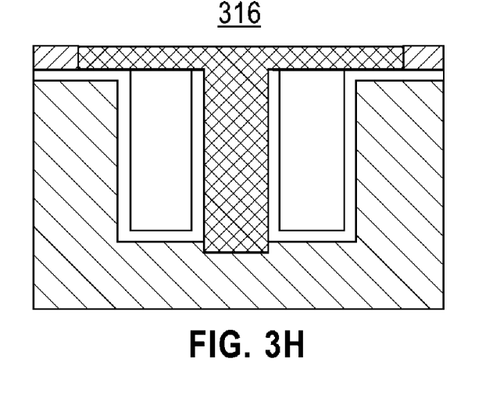
Figure 3I:
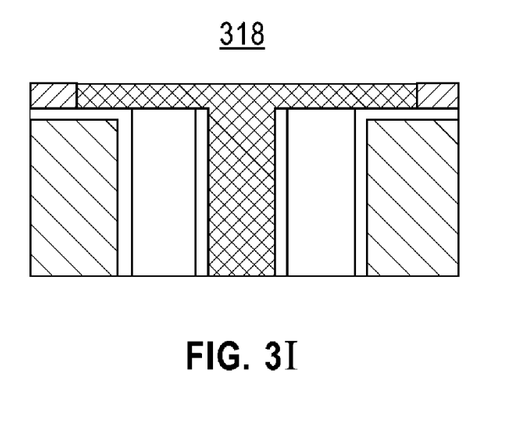
Figure 3J:
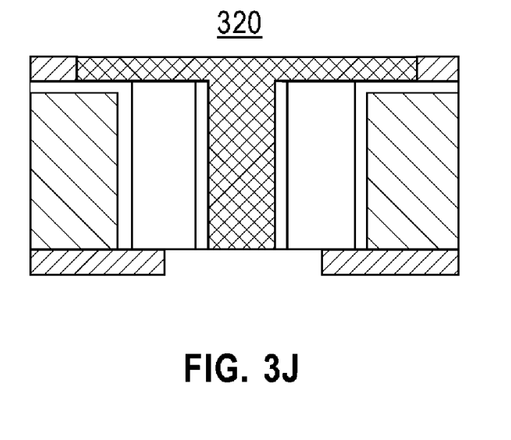
Figure 3K:
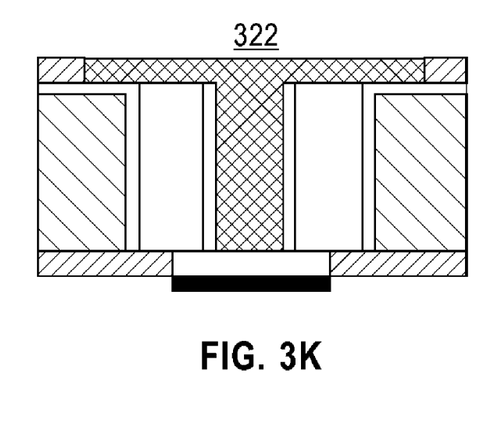
Figure 3L:
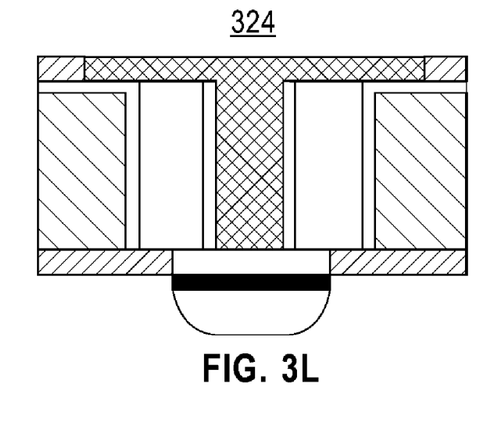

Referring to FIG. 2, the structure of the vias 107 is shown. Each via structure 107 comprises a conductive (preferably copper) through via collar 202 exposed at the top surface of the carrier 204. A preferably copper pad 212 is exposed at the bottom surface of the carrier 204, and a preferably copper through via post 206 is disposed between the collar 202 and the pad 212.

The CTE matched chip carrier 204 is made from a material such as Silicon in which the through vias provide compliance and a path to simultaneously increase I/O density and interconnect compliance to an organic substrate 216. For example, the CTE of Silicon is roughly 3 ppm (parts per million) and Organic substrates are between 13-15 ppm. The resulting CTE mismatch for a 40 mm square carrier would result in a roughly 10 micron lateral displacement between the carrier and organic substrate for a 50 deg C. temperature variation.

The conductive copper structure extends through a hole 208 in the silicon carrier substrate 204. The hole can be filled with a low modulus material. The copper collar 202 is bonded to the silicon chip carrier 204 at the top surface and attached to the copper post 206 which is in turn attached to a copper micropad which supports the Copper Pad/BLM (Ball Limiting Metallurgy) 212. A C4 solder microjoin 210 is created, for example by plating a lead tin solder ball onto Copper Pad/BLM (Ball Limiting Metallurgy) 212, which is then melted to join 212 to a matching solder bonding pad/TSM (Top Surface Metallurgy) 214 on the next level package structure, which in this case is an organic substrate 216.

As the copper post 206 is either freely floating in the silicon chip carrier 204 through the via hole or softly supported by a compliant material, relative thermal expansion of the silicon chip carrier 204 to organic substrate 216 will result in deflection of the copper post 206 in the longitudinal direction. This compliance will reduce the thermo-mechanical induced stress on the C4 solder microjoins 210 which connect the Copper Pad/BLM 212 and the Solder Pad/TSM 214 to make an electrical connection between the silicon carrier 204 and the next level package organic substrate 106.

Figure 7:
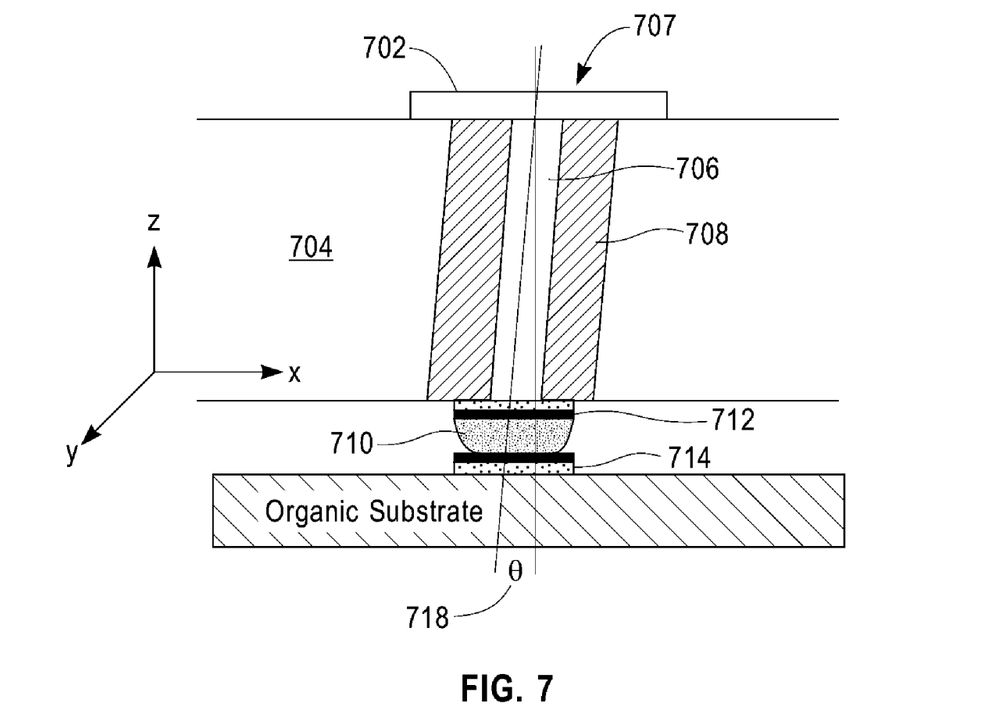
FIG. 7 shows a compliant interconnect which provides compliance in both the longitudinal and vertical directions.

A method for providing a through via structure 707 with compliance in both the vertical and longitudinal directions is shown in FIG. 7. In this embodiment, the copper post 706 in the via hole 708 is fabricated at an angle theta 718 with respect to the vertical mounting direction. The angle may be, for example, between 30 to 45 degrees. In response to a vertical force the post 706 will bend to provide compliance in the vertical direction while simultaneously providing compliance in the longitudinal directions. The via structure 707 in the carrier 704 also includes: a through via collar 702; a copper pad/BLM 712; and solder bonding pad/TSM 714 with solder microjoins 710.

Figure 8:
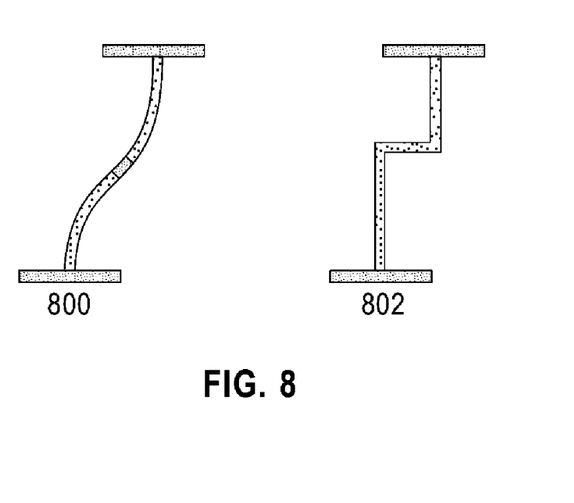
FIG. 8 shows other more complex geometric shapes such as an S-shaped post and an L-shaped post.

While the example is shown for the embodiment of an angled post, other more complex geometry shapes as shown in FIG. 8 such as an S-shaped post 800 or an L-shaped post 802 may also be used to provide compliance in all directions.

Compliant Via with a Soft Material

A method of fabricating compliant through vias using a soft material according to another embodiment of the invention is shown in FIGS. 3A-L. In step 302 the silicon is patterned with photo resist. In step 304 an annulus is etched into the silicon wafer using the well known deep RIE (reactive ion etching) processes. Following the etching, a thermally grown oxide is used to insulate the via as shown in step 306. In step 308 the annulus is filled with a compliant material, which for example may be a photoresist or epoxy with a modulus well below that of silicon. In step 310 the silicon is again patterned, which is followed by an RIE to remove the oxide and a DRIE (deep reactive ion etching) to remove the silicon center post in step 312. In step 314 the silicon is re-patterned and in step 316 it is copper plated to form a via collar and post. In step 318 the backside of the wafer is ground and polished to expose the copper post. In step 320 the backside of the wafer is patterned and in step 322 plated to form the copper pad and BLM. In step 324 C4 Solder Bumps are fabricated onto the BLM using plating or other transfer methods.

Compliant Via with Void

A method of fabricating through vias in a void according to another embodiment is shown in FIG. 4. In Step 402 the silicon substrate is patterned using photo resist and in Step 404 an annular via is deep reactive ion etched. In step 406 a thermal oxide is grown on the surface and sidewalls of each annular via and in Step 408 each annular via is filled with poly silicon. The substrate is planarized in Step 410 and an oxide is grown in Step 412. In Step 414 the top surface is patterned with photoresist and both oxide and silicon are etched in Step 416 to a depth beyond the polysilicon annular via. In Step 418 the top surface is patterned and platted with copper to form a via collar and post. In Step 420 the backside of the wafer is ground, polished and etched to expose the copper via post. In step 422 the backside of the wafer is patterned and in Step 424 the copper pad and BLM are plated. In step 426 the backside of the wafer is patterned to expose the silicon surrounding the copper via. In Step 428 the silicon surrounding the copper post is preferentially etched with a fluorinating agent, such as, but not limited to, Xenon Difluoriode.

Figure 4A:
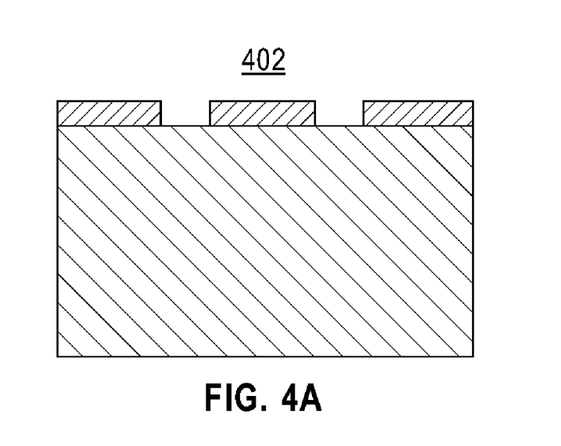
FIG. 4A through FIG. 4O show a process of fabricating through vias with a void to form compliance.
Figure 4B:
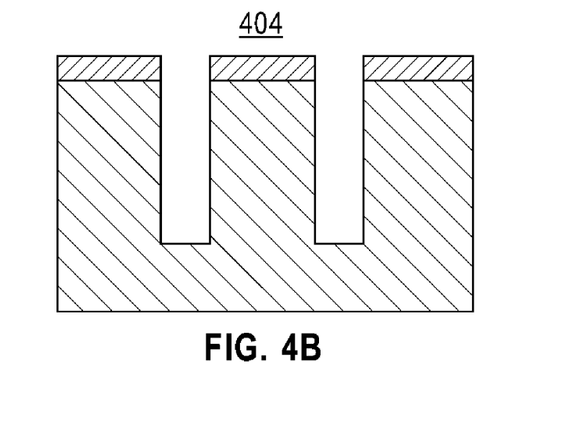
Figure 4C:
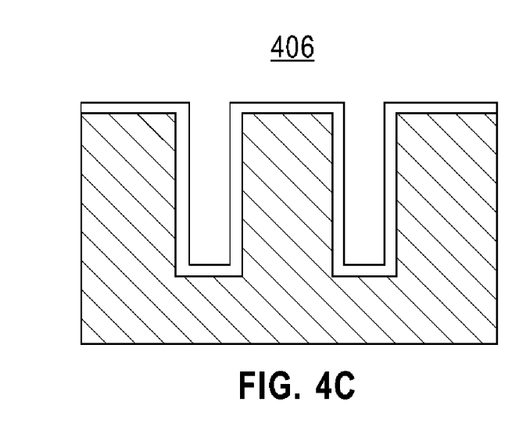
Figure 4D:
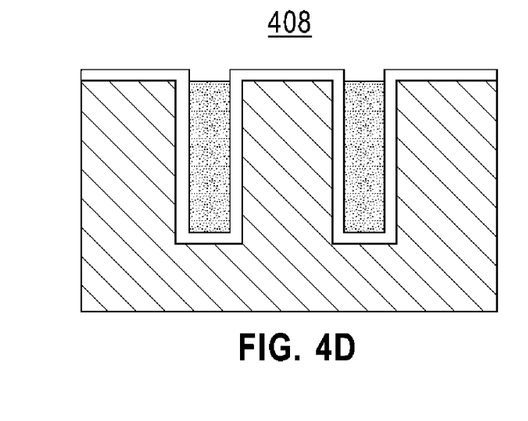
Figure 4E:
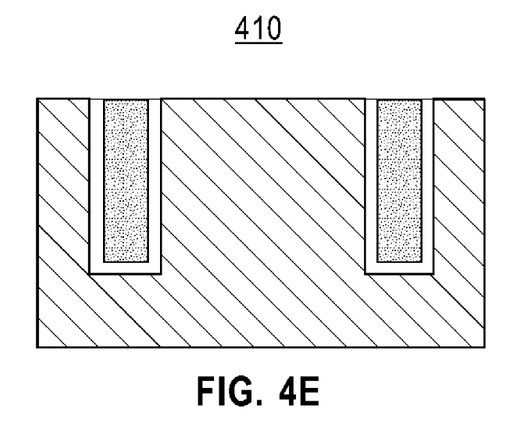
Figure 4F:
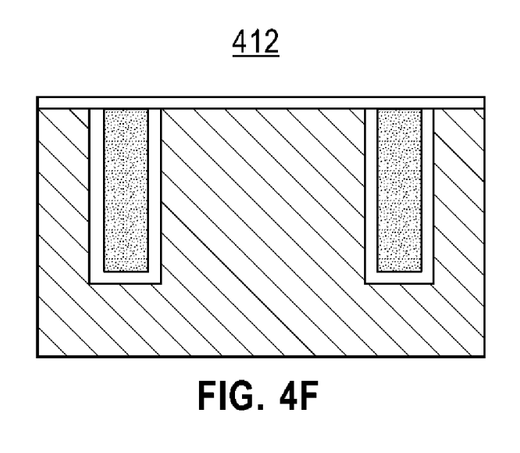
Figure 4G:
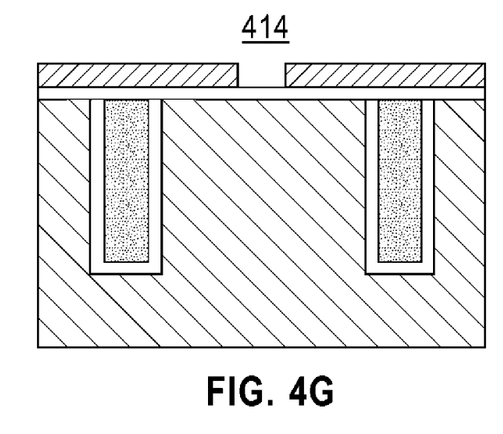
Figure 4H:
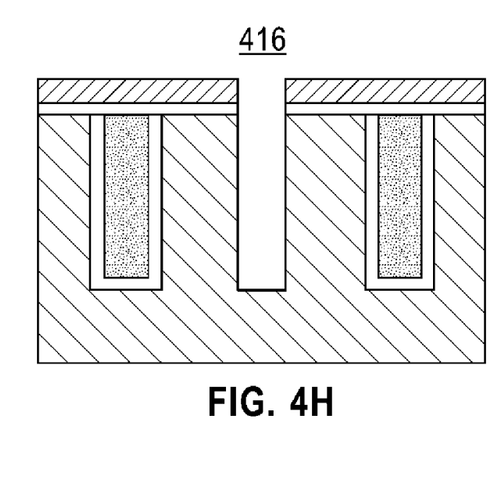
Figure 4I:
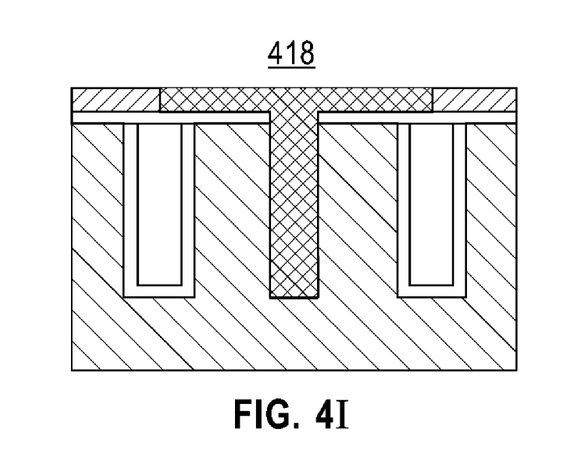
Figure 4J:
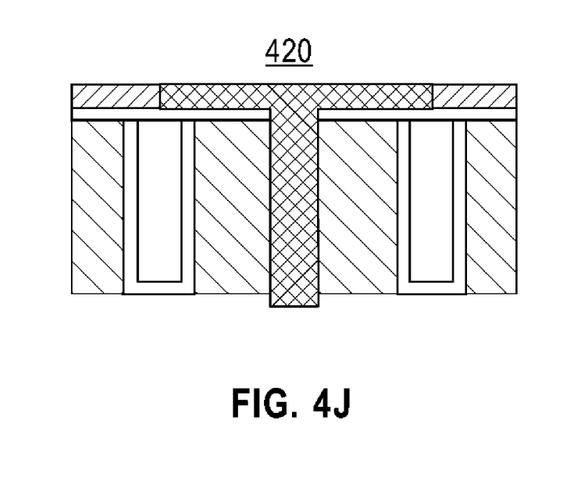
Figure 4K:
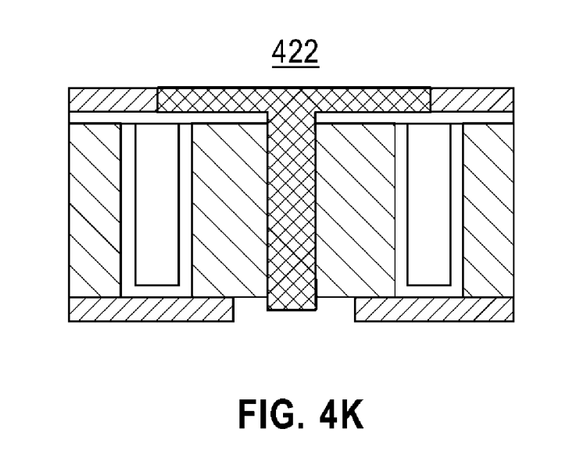
Figure 4L:
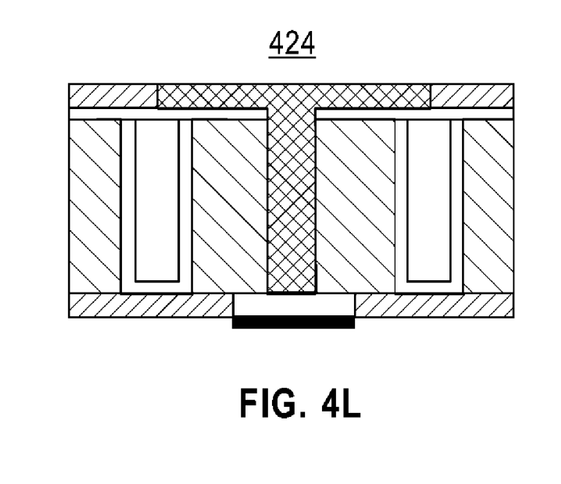
Figure 4M:
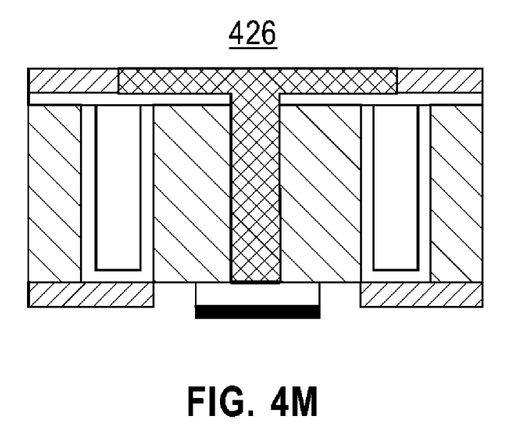
Figure 4N:
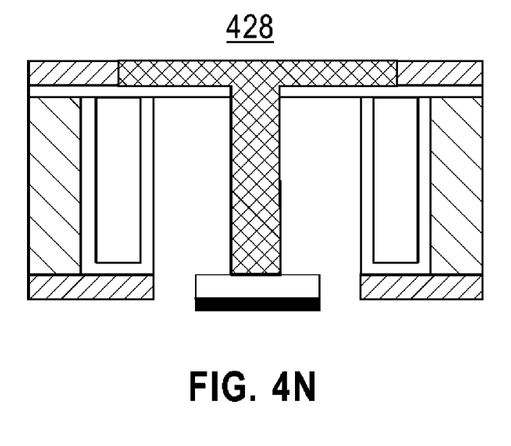
Figure 4O:
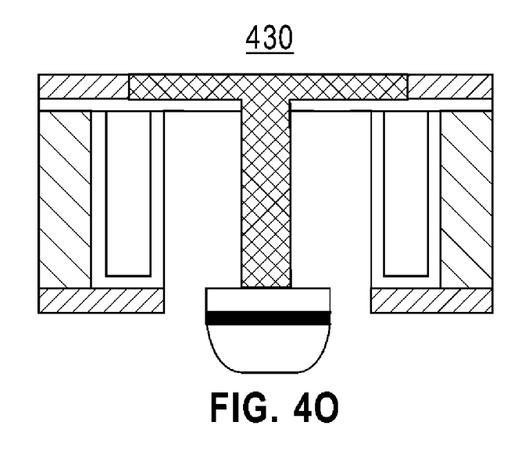

The silicon oxide on the via walls provide an etch stop and the Xenon Difluoriode removes the silicon surrounding the copper post to define a void. In Step 430 solder bumps are fabricated onto the BLM structure using either a plating or transfer process resulting in a via post which is free floating within the silicon substrate. This allows for compliance of the via post.

In summary, a silicon chip carrier with a CTE matched to silicon combined with an integrated through via technology which provides compliance can be used to provide a solution for both high density I/O and increased compliance for system integration. While the above description is for a silicon chip carrier, any material which is close in CTE match to silicon and allows processing of vias can be used.

Figure 5A:
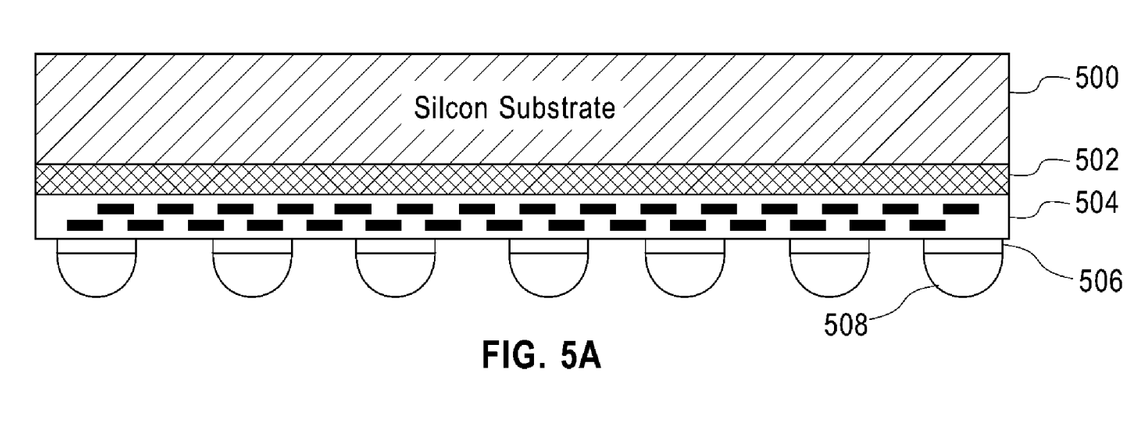

An alternative to using a silicon interposer (or carrier), as shown in FIGS. 1 and 2, is to incorporate a compliant interconnect directly into the silicon chip. As shown in FIG. 5A, a silicon device comprises a silicon substrate 500 which includes active device layers 502 and several BEOL (back-end-of-line) metal interconnect layers 504 which comprise the C4 pads 506 which hold solder bumps 508 to attach the chip to the next level package.

Figure 6:
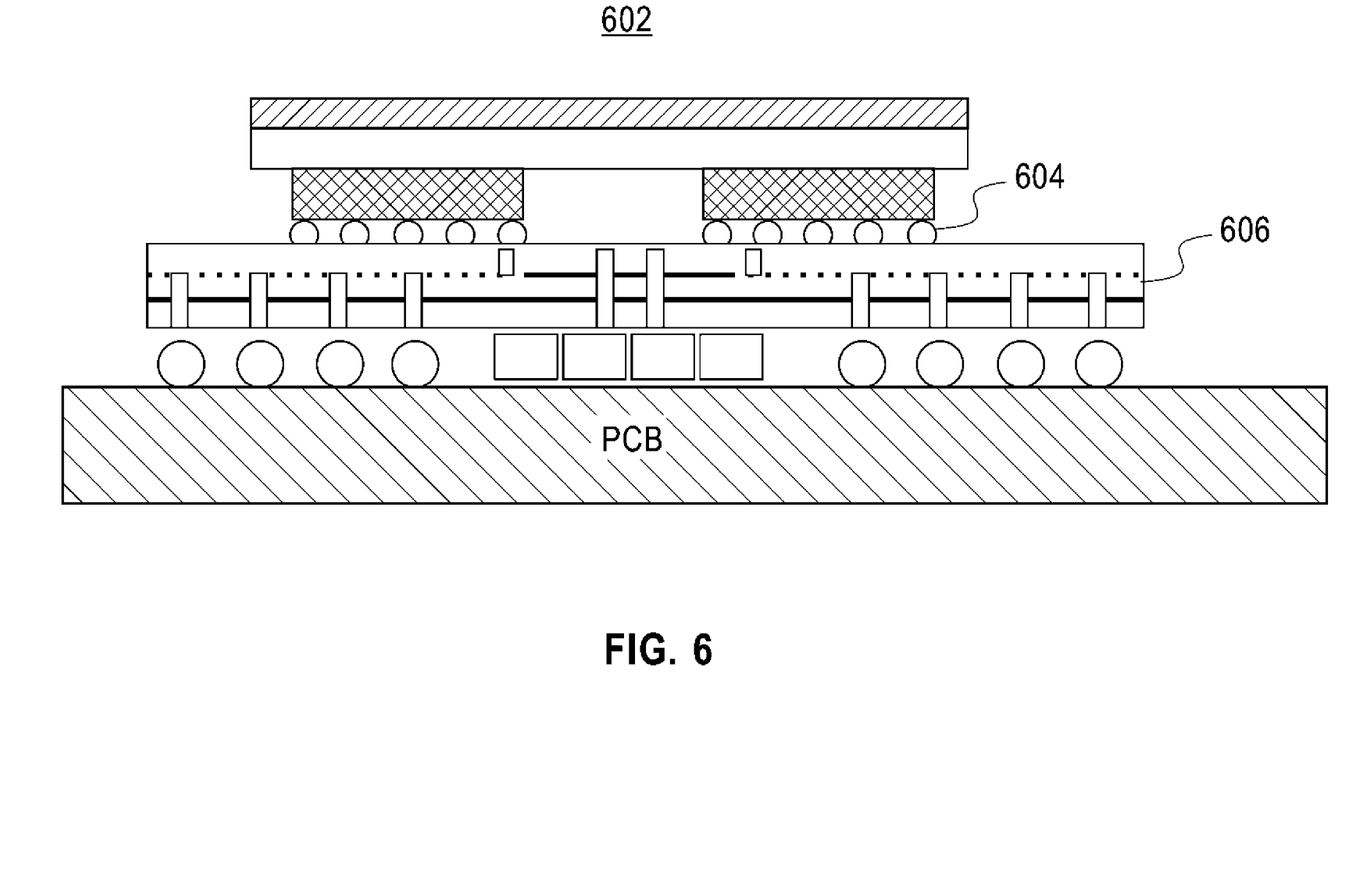
FIG. 6 shows chips mounted onto an organic substrate.

As shown in FIG. 6, the chips 602 are directly attached to an organic carrier substrate 606. In this case, the compliance between the chip 602 and next level package 606 is determined by the compliance of the C4 solder microjoins 604. The resulting thermo mechanical stress on the BEOL wiring structure will depend upon the CTE mismatch of the chip to carrier, the temperature delta of the chip to carrier and the compliance of the microjoins.

Figure 5B:
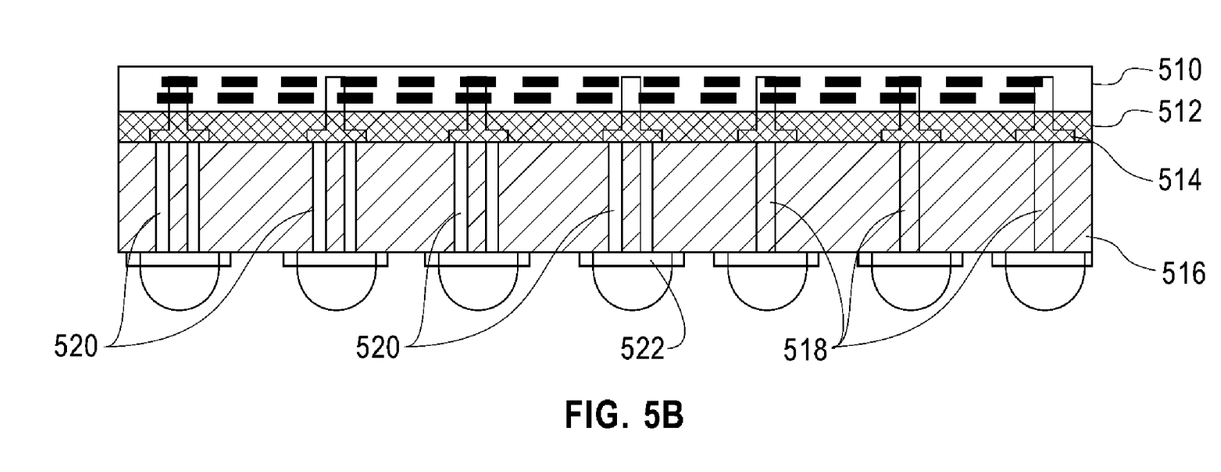

A compliant interconnect structure 510 can be integrated into the silicon chip as shown in FIG. 5B which is fabricated upon a silicon substrate 516, with active devices 512, which includes through vias 518,520 to connect the BEOL wiring 510 to the C4 pads 522. In this case, the compliance between the chip and next level package is determined by the through via compliance in series with the compliance of the C4 microjoins. The through via copper collar 514 is attached to the silicon substrate 516 rather than the BEOL wiring 510. As a result the thermo mechanical stress due to CTE mismatch of the chip to substrate will not be directly applied to the BEOL wiring levels but rather to the C4 microjoins and though vias.

The through via compliance in FIG. 5B may be designed to meet the requirements of the package. In the case where through via compliance is required, this may be achieved by a copper post within a void or low modulus material as shown as 520. In cases where the thermo mechanical stress is within the acceptable stress range of the C4 microjoins and silicon carrier substrate the compliance requirements of the through vias may be near zero which may be achieved by incorporating a through via which is fully filled with copper without a void or low compliance material as shown in 518.

Figure 5C:
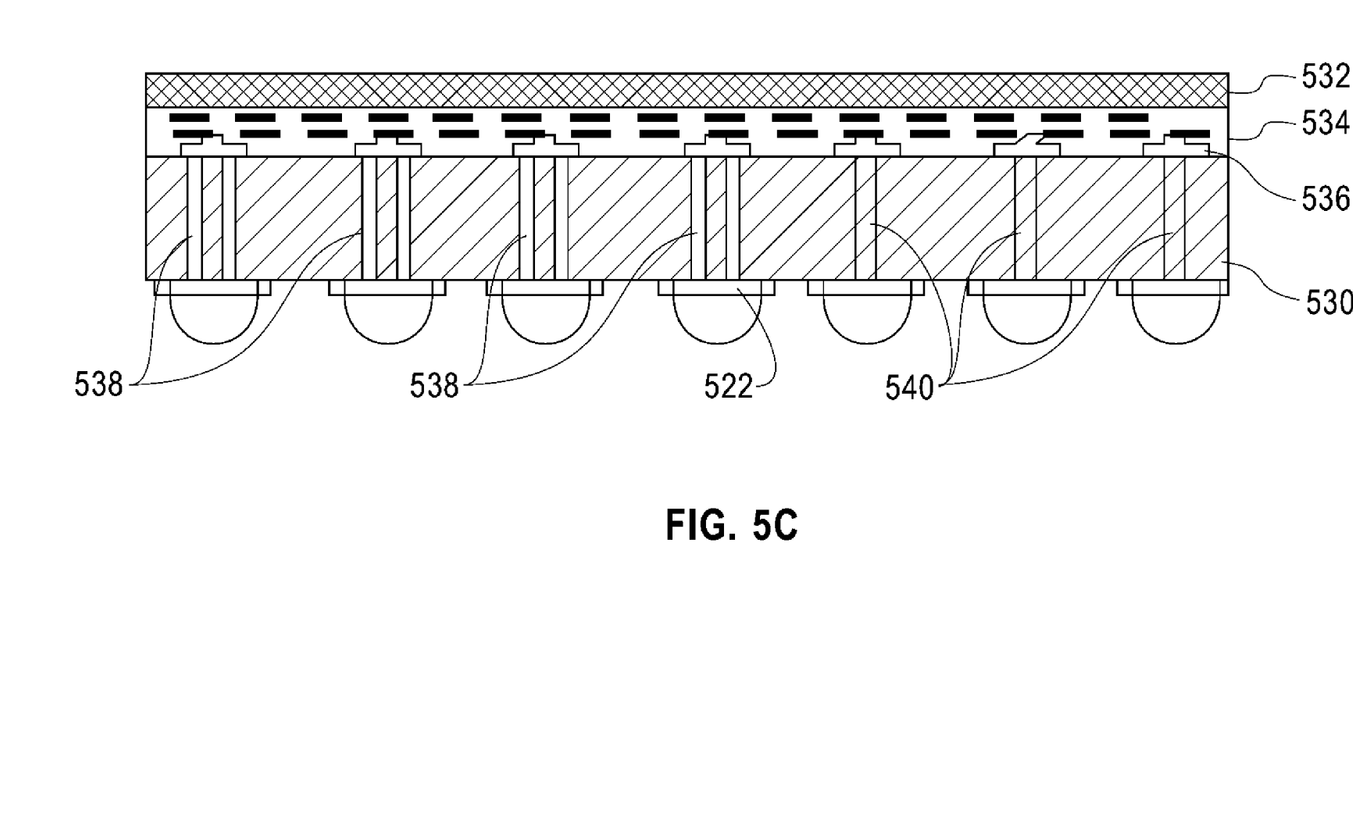

An additional design benefit as shown in FIG. 5B is elimination of the thermal impedance of the silicon substrate 500 to a heat sink as shown in FIG. 6. A second fabrication option shown in FIG. 5C places the active devices 532 on top of the BEOL wiring 534 using, for example "Silicon on Insulator" technology. In this case the through vias do not go through the active device region and provide more silicon area for circuit fabrication. The through via collar 536 is attached to the silicon substrate 530 to reduce the effects of thermo mechanical stress on BEOL wiring. As in FIG. 5B, depending on compliance requirements the through vias may have voids or low modulus material 538 or be fully filled 540. Also, by placing the active layer 532 at the top most surface of the chip structures eliminates the thermal impedance of both the silicon substrate 500 as shown in FIG. 5A and the BEOL wiring 510 as shown in FIG. 5B, thereby creating a more efficient thermal path.

Therefore, while there has been described what is presently considered to be the preferred embodiment, it will be understood by those skilled in the art that other modifications can be made within the spirit of the invention.

I claim:

1. A silicon chip package comprising:
    a carrier comprising a first coefficient of thermal expansion;
    an organic substrate connected to a bottom surface of the carrier, said organic substrate comprising:
        a second coefficient of thermal expansion providing a mismatch with the first coefficient of thermal expansion;
        a layer of active devices comprising a third coefficient of thermal expansion approximately matching the first coefficient of thermal expansion; and
        back-end-of-line wiring connected to the active devices;
    a plurality of pads exposed at a bottom surface of the carrier; and
    a plurality of through vias to connect the back-end-of-line wiring to the plurality of the pads, each of the plurality of through vias comprising:
        a collar exposed at a top surface of the carrier;
        a pad exposed at a bottom surface of the carrier; and
        a through via post disposed between the collar and the pad.

2. The silicon chip of claim 1 in which the plurality of through vias are completely filled with a conductive metal.

3. The silicon chip of claim 2 wherein the vias are fabricated from copper.

4. The silicon chip of claim 1 in which the through via post is freely floating, extending through a volume of empty space.

5. The silicon chip of claim 1 in which the plurality of through vias are filled with a low modulus material softly supporting the through via post.

6. The silicon chip of claim 1 in which the through via post is placed at an angle which is not perpendicular to the organic substrate, providing compliance in a vertical direction while providing compliance in longitudinal directions.

7. The silicon chip of claim 6 wherein the post is fabricated at angle between 30 and 45 degrees.

8. The silicon chip of claim 6 wherein the post is fabricated with a curved section.

9. The silicon chip of claim 8 wherein the post is S-shaped.

10. The silicon chip of claim 6 wherein the post is L-shaped.

11. The silicon chip of claim 1 wherein the carrier is fabricated from silicon.

12. The silicon chip of claim 1 wherein the organic substrate is connected to the bottom surface of the carrier by solder bumps.

13. A silicon chip comprising:
    a top surface; and
    a bottom surface;
    a silicon substrate comprising a layer of active devices at the top surface of the silicon chip; and
    back-end-of-line wiring connected below the layer of active devices;
    a plurality of pads disposed along the bottom surface of the silicon chip; and
    a plurality of through vias that connect the back-end-of-line wiring to the plurality of the pads, each of the plurality of through vias comprising:
        a collar exposed at a top surface of the substrate; and
        a through via post disposed between the collar and the pad, said through via post placed at an angle which is not perpendicular to the substrate, providing compliance in a vertical direction while providing compliance in longitudinal directions.

14. The silicon chip of claim 13 wherein the back-end-of-line wiring is connected below the layer of the active devices using silicon on insulator technology.

* * * * *